United States Patent [19]
Partovi et al.

[11] Patent Number: 6,078,487
[45] Date of Patent: Jun. 20, 2000

[54] ELECTRO-STATIC DISCHARGE PROTECTION DEVICE HAVING A MODULATED CONTROL INPUT TERMINAL

[75] Inventors: Hamid Partovi, Westboro; Kaizad R. Mistry, Brighton; David B. Krakauer, Cambridge; William A. McGee, Shrewsbury, all of Mass.

[73] Assignee: Digital Equipment Corporation, Maynard, Mass.

[21] Appl. No.: 08/853,840

[22] Filed: May 9, 1997

Related U.S. Application Data

[63] Continuation of application No. 08/584,996, Jan. 11, 1996, abandoned, which is a continuation of application No. 07/861,401, Mar. 31, 1992, abandoned.

[51] Int. Cl.$^7$ .......................................................... H02H 9/00
[52] U.S. Cl. ........................... 361/56; 361/91.1; 361/111; 361/118
[58] Field of Search ................................ 361/56, 58, 111, 361/113, 115, 91.1, 118, 119, 127

[56] References Cited

U.S. PATENT DOCUMENTS

| | | | |
|---|---|---|---|
| 4,859,875 | 8/1989 | Tihanyi et al. | 307/549 |
| 5,208,719 | 5/1993 | Wei | 361/56 |
| 5,237,395 | 8/1993 | Lee | 361/56 |

OTHER PUBLICATIONS

"Dynamic Gate Coupling of NMOS for Efficient Output ESD Protection" Charvaka Duvvury and Carlos Diaz, Mar. 31, Apr. 1–2, 1992, Institute of Electrical and Electronics Engineers, Inc., pp. 141–150.

*Primary Examiner*—Stephen W. Jackson
*Attorney, Agent, or Firm*—Cesari and McKenna, LLP

[57] ABSTRACT

A circuit which protects an integrated circuit (IC) device from damage due to electrostatic discharge (ESD). The protection circuit includes an N-channel metal oxide semiconductor field effect transistor (MOSFET) clamping device and a gate modulation circuit. The source and drain of the MOSFET clamp are connected between an input/output (I/O) pad of the IC and a ground reference voltage. During normal operation of the IC, the gate modulation circuit disables the MOSFET clamp by connecting its gate terminal to a ground reference voltage. This permits signal voltages to pass between the I/O pad and any operating circuits connected to the pad. During an ESD event, the gate modulation circuit connects the gate to the I/O pad, which enables the MOSFET clamp, causing any ESD voltages and resulting currents to be shunted through the MOSFET clamp to ground. As a result, the ESD clamp reaches its clamped-to snapback voltage via an increase in MOSFET channel current, and not via junction breakdown. This insures that the ESD clamp reaches its snapback voltage before the onset of junction breakdown in the operating circuits. The circuit is especially useful in integrated circuits where the gate oxide of a standard ESD clamp transistor is too thin to protect the operating logic from I/O signal voltages that are greater than the supply voltage used for the operating logic circuits.

21 Claims, 5 Drawing Sheets

ELECTRO-STATIC DISCHARGE PROTECTION DEVICE HAVING A MODULATED CONTROL INPUT TERMINAL

This application is a continuation of application Ser. No. 08/584,996, filed Jan. 11, 1996 now abandoned.

This application is a continuation of application Ser. No. 07/861,401, filed Mar. 31, 1992 now abandoned.

FIELD OF THE INVENTION

This invention relates generally to integrated circuit design, and more particularly to an electrostatic discharge (ESD) protection circuit which selectively activates an ESD clamp device to optimally control ESD without interfering with normal operation of the integrated circuit.

BACKGROUND OF THE INVENTION

The semiconductor devices in integrated circuits (ICs) are well-known to be particularly susceptible to damage by electrostatic discharge (ESD). This is particularly true for metal oxide semiconductor field effect transistors (MOSFETs), but is also a problem for small geometry bipolar devices. Susceptibility to ESD is principally due to the fact that the devices inside an IC are formed from small regions of P-type and N-type semiconducting materials and thin insulating oxides. When an accumulation of static charge is suddenly applied to a device, a normally reverse-biased PN junction may be activated into a regime of high current. If the ESD voltage is sufficiently high, permanent damage to the junctions, surrounding oxides, and/or interconnect metal may result.

An integrated circuit typically experiences an ESD event via the application of static charge to one of its input or output (I/O) terminals (or "pads"). To prevent an excessive static charge from reaching the operating circuits inside the chip, an extra semiconductor device, called an ESD clamp device, is connected between the operating circuits and each pad. The ESD clamp should not affect normal operation of the IC. However, during an ESD event, the ESD clamp shunts the resulting high currents away from the operating circuits, and clamps the pad to a hold voltage known to be safe.

There are two arrangements commonly used for ESD protection, the so-called grounded-gate clamp and the diode-connected clamp. In the grounded arrangement, the ESD transistor is connected between the pad and a ground reference. The control terminal of the transistor is grounded as well. For example, if an N-channel MOSFET is used as the ESD clamp, its drain terminal is connected to the pad, and its source and gate terminals are connected to ground. The ESD clamp thus remains off in normal operation, and its presence does not affect the operating logic circuits.

However, during an ESD event, the pad voltage increases, and a trigger voltage is eventually reached which permits current to begin to flow from the pad through the channel to ground. The ESD clamp then eventually settles into a fairly stable, bipolar conduction region, where it remains clamped at a hold voltage, Vhold, over a wide range of pad currents.

A grounded ESD clamp has certain shortcomings, however. Semiconductor devices are normally made as small as possible, so that as many as possible will fit within a single IC. The trigger voltage of the ESD clamp should normally be as high as possible, to prevent premature triggering. However, guaranteeing a high trigger voltage is difficult with small geometry devices.

Furthermore, although a grounded-gate MOSFET clamp will remain off during normal operation of the IC, full range swing switching voltages will appear at its drain terminal via the pad. The resulting continuous abnormal stress on the drain to gate oxide of the MOSFET clamp may actually change its operating characteristics over the long term.

A diode-connected clamp overcomes certain of these difficulties. It consists of an ESD device having its control terminal connected to the pad instead of ground. The threshold, or "turn-on" voltage, Vt, of the ESD device is tailored, so that it remains off in normal operation of the IC. During an ESD event, however, when the pad voltage rises above Vt, the ESD clamp is enabled to shunt the voltages and currents appearing at the pad to ground.

The channel current induced in a diode-connected clamp helps avoid the need for high trigger voltages or continuous stress on the drain to gate interface. Unfortunately, diode-connected clamps have certain other problems. While drain to gate stress is avoided, source to gate stress is created.

The Vt of the ESD clamp must normally be increased, to insure that it remains off during normal, non-ESD operation. However, the higher Vt also means that a higher clamping voltage results. It is, however, typically advantageous to clamp to as low a voltage as possible during an ESD event, so that the protected logic circuits see as small a voltage as possible.

Another problem with ESD clamps of both types occurs because of parasitic capacitance effect. This effect may enable an output transistor in the operating circuits during the early stages of an ESD event. If this activated output transistor then reaches its trigger voltage before the diode-connected ESD clamp reaches its own trigger voltage, the operating circuits will be exposed to ESD damage.

In addition, the supply voltage used for the operating circuits internal to the chip are sometimes lower than the maximum signal voltages applied to the pads. While this permits the operating circuits internal to the IC to consume less power, it also exacerbates the design of the ESD clamp. For example, an ESD clamp may be required to permit a five-volt signal to pass through the pad to the operating circuits, while still adequately protecting two-to-three volt internal operating devices.

What is needed is an ESD protection circuit which provides the advantages of a grounded clamp, by remaining off during normal operation, and the advantages of a diode-connected clamp, by quickly reaching a hold voltage during an ESD event.

The protection circuit should remain completely off during normal operation of the IC, even in the presence of signal voltages at the pad which exceed the threshold voltage of a standard transistor. The protection circuit should also be quickly placed in the hold state upon the occurrence of an ESD event, without the need for a high trigger voltage to occur first.

SUMMARY OF THE INVENTION

The invention is an electrostatic discharge (ESD) protection circuit that includes an ESD clamp device and a modulation circuit. The modulation circuit normally connects a control terminal of the ESD clamp to a low reference voltage during normal operation, but connects the control terminal to its associated input/output (I/O) pad during an ESD event.

As a result, the ESD clamp enters the hold state much more quickly and uniformly, via a gradual increase in ESD device current, rather than by a delayed but sudden activation of one of its semiconductor junctions.

In one embodiment the ESD clamp consists of an N-channel MOSFET having its drain terminal connected to the I/O pad, its source terminal connected to a ground reference voltage, and its gate terminal connected to the output of an inverter. The inverter, which serves as the modulation circuit, is formed from a P-channel, pull-up MOSFET and an N-channel pull-down MOSFET. The gate terminals of the pull-up and pull-down MOSFETs are connected to a supply voltage. During normal operation, the supply voltage activates the pull-down MOSFET, thereby grounding the gate of the ESD clamp, and thus disabling the ESD clamp. However, during an ESD event, the pull-up MOSFET is activated, to permit the gate voltage of the ESD clamp to rise. This gradually activates the ESD clamp to enter a bipolar conduction region without first experiencing punchthrough.

The gate voltage of the ESD clamp may be coupled high during an ESD event by any other suitable means, such as a capacitance connected between the pad and the gate.

The protection circuit can be used in applications where the maximum normal signal voltages applied to the pad exceed the supply voltage used for the operating circuits internal to the integrated circuit. In such an application, the ESD clamp is implemented as a device having a larger than normal threshold voltage, which enables tailoring of the ESD device turn-on voltage to avoid stress on the source to gate and drain to gate interfaces. The threshold voltage of an N-channel MOSFET ESD clamp may be increased, for example, by increasing its gate oxide thickness. This prevents activation of the ESD clamp when a signal voltage higher than the internal supply voltage appears at the pad.

The invention has several advantages. During normal operation, the ESD device is completely off, which avoids undue stress on the gate interface. In addition, during an ESD event, the presence of channel current guarantees that the clamp will be in the bipolar conduction region and clamped at the hold voltage before any of the operating circuits reach a trigger voltage. As a result, the maximum voltage experienced during an ESD event by the operating circuits is reduced.

BRIEF DESCRIPTION OF THE DRAWINGS

The novel features believed to be characteristic of the invention are pointed out in the appended claims. The best mode for carrying out the invention and its particular features and advantages can be better understood by referring to the following detailed description, read together with the accompanying drawings, in which:

DESCRIPTION OF ILLUSTRATIVE EMBODIMENTS

Figure 1:
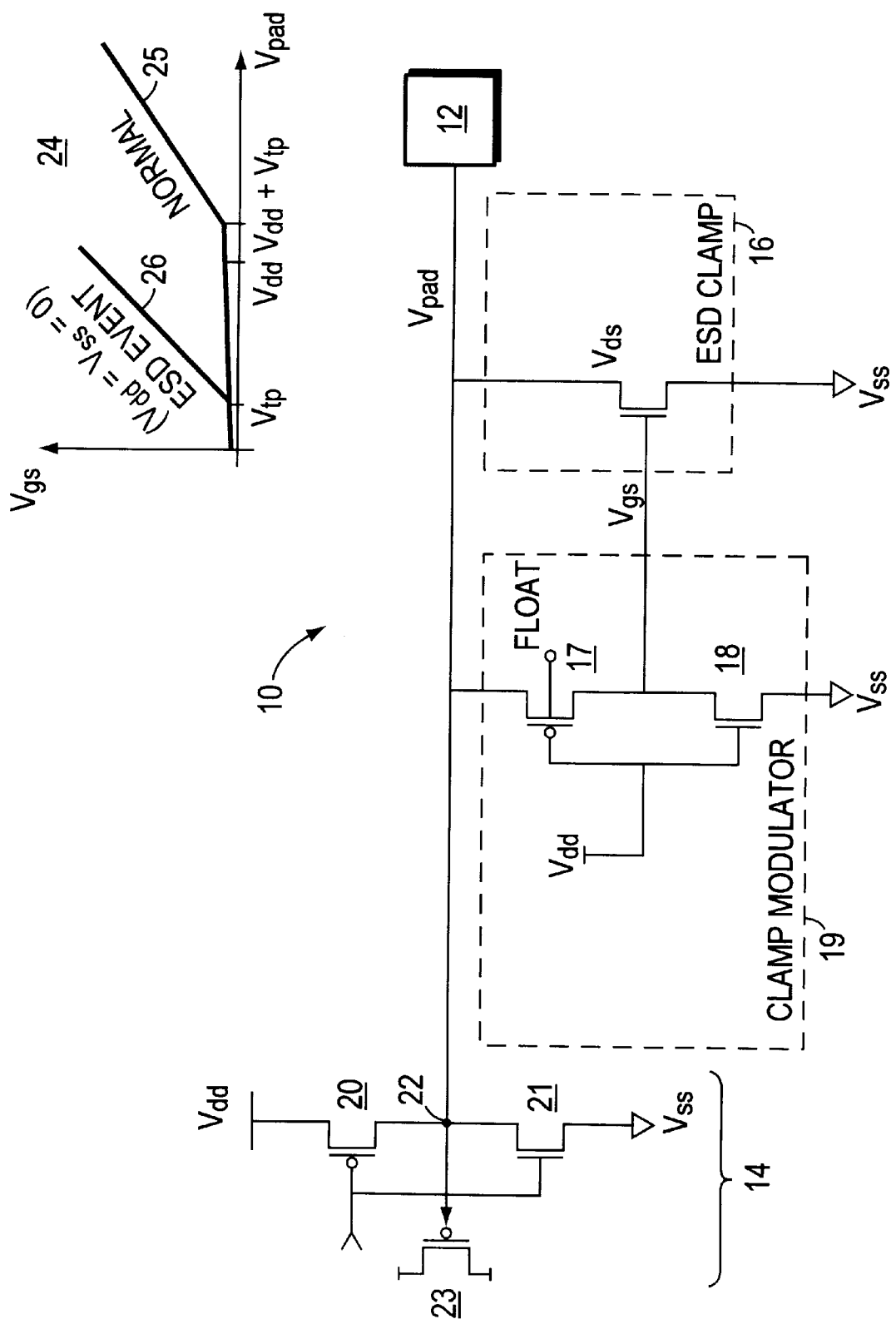
FIG. 1 is an electrical schematic diagram of a gate-modulated electro-static discharge (ESD) protection circuit for use with complementary metal-oxide semiconductor (CMOS)-type operating logic circuits, according to one embodiment of the invention.

FIG. 1 is an electrical schematic diagram of an electro-static discharge (ESD) protection circuit 10 according to the invention, which protects an integrated circuit (IC) from electrostatic discharge events. The protection circuit 10 is connected to an input or output (I/O) terminal ("pad") 12 of the IC to protect an operating circuit 14 from ESD events occurring at the pad 12.

In its most general form, the invention consists of an ESD clamp device 16 and a clamp control, or modulator, circuit 19. During normal operation of the IC, the modulator circuit 19 disables the ESD clamp, so that the clamp presents a high impedance between the pad 12 and a ground reference voltage, Vss. However, during an ESD event, the modulator circuit 19 activates the ESD clamp, causing it to close a low impedance path between the pad and Vss. This shunts the ESD voltages and currents away from the operating circuits 14, and clamps the pad 12 to a hold voltage, Vhold (not shown in FIG. 1).

In the illustrated circuit, which is but one embodiment of the invention, the ESD clamp 16 consists of an N-channel MOSFET transistor, and the modulation circuit 19 consists of an N-channel MOSFET pull-down transistor 18 and a P-channel MOSFET pull-up transistor 17. The clamp transistor 16 is a standard, thin gate oxide device, having its source connected to a ground reference terminal, Vss, and its drain connected to the pad 12. The gate to source voltage, Vgs, appearing at the ESD clamp 16 is controlled by the ESD pull-down and ESD pull-up transistors 17 and 18. The ESD pull-up transistor 17 has its source terminal connected to the pad 12 and its drain terminal connected to the drain terminal of the ESD pull-down transistor 18. The source terminal of the ESD pull-down transistor 18 is connected to the terminal ground reference, Vss. The gate terminals of the ESD pull-up and pull-down transistors 17 and 18 are connected to a positive supply terminal Vdd; the N-well of the ESD pull-up transistor 17 is allowed to float.

The illustrated gate modulation circuit 19 can be thought of as a logic inverter, where a Vdd supply voltage is connected to the logic signal input, and the pad voltage, Vpad, is connected to a power supply input terminal. Other types of inverters may also be used, such as a pull-down transistor 18 and capacitance (not shown) coupled between the pad and the gate of the ESD clamp 16.

If the pad 12 is an output pad, the operating circuit 14 typically includes an output transistor stage consisting of a P-channel pull-up transistor 20 and an N-channel pull-down transistor 21. If the pad 12 is an input pad, the operating circuit 14 typically includes a transistor 23 controlled by the pad 12.

During normal operation of the IC, the ESD pull-up transistor 17 is disabled, due to the fact that the positive supply voltage Vdd is connected to its gate terminal. The ESD pull-down transistor 18 is enabled, however, which means that the gate terminal of the ESD clamp 16 is connected to the ground reference voltage, Vss. Since the gate to source voltage, Vgs, of the ESD clamp 16 is thus also at ground, the ESD clamp 16 remains off. For present-day integrated circuit technologies, the threshold voltage Vt is approximately 0.6 volts, and supply voltage, Vdd, is typically in the range of two to five volts.

As long as Vpad remains between zero volts and Vdd plus |Vtp|, where |Vtp| is the absolute value of the turn-on threshold voltage of the pull-up transistor 17, the pull-down transistor 18 remains on, the pull-up transistor 17 remains off. As a result, the gate voltage, Vgs, of the ESD clamp 16 remains at zero volts. The operating logic 14 is permitted to either drive or sense the voltage at the pad 12.

The operation of the protection circuit 10 can also be understood by referring to the plot 24 of gate-to-source voltage, Vgs, versus pad voltage, Vpad. Curve 25 depicts the behavior of the ESD clamp 16 during normal, non-ESD event operation. In this regime, Vgs remains low, which effectively shuts off the ESD clamp 16. This is true until Vpad as shown in FIG. 1 reaches Vdd plus the pull-up transistor threshold voltage, |Vtp|.

During an ESD event, the IC is typically off or otherwise not connected in a circuit, so that the supply voltage Vdd and ground reference voltage, Vss are the essentially the same, at zero volts. However, when an ESD voltage appears at the pad 12, the gate modulation circuit 19 is activated, and thus inverts the logic "zero" at its input to begin driving a logic "one" at its output, and thereby activating the ESD clamp 16.

More particularly, as the ESD voltage applied to the pad 12 rises to a voltage which is higher than Vdd plus |Vtp| (which is simply Vtp in an ESD event, since Vdd is zero volts), the pull-up transistor 17 is activated. This causes the gate voltage, Vgs, of the ESD clamp 16 to follow the pad voltage, Vpad. As a result, the high ESD voltages and currents appearing at the pad 12 are shunted away from the pull-up and pull-down transistors 20 and 21 and towards the ground reference, Vss.

Thus, as depicted by curve 26, during an ESD event, Vgs remains low only until Vpad reaches the absolute value of the threshold voltage, |Vtp|. At this point, as Vpad continues to rise, so does Vgs.

The invention thus avoids a difficulty with certain grounded-gate prior art protection schemes which occur when the pull-down transistor 21 is enabled during an ESD event. In particular, a logic high voltage may be coupled to the gate of transistor 21 during an ESD event. This, in turn, means that the gate voltage of the pull-down transistor 21 may rise faster than the gate voltage, Vgs, of the ESD clamp 16. This does not occur with the invention, although the coupling still occurs, as can be understood by referring to FIG. 2.

Figure 2:
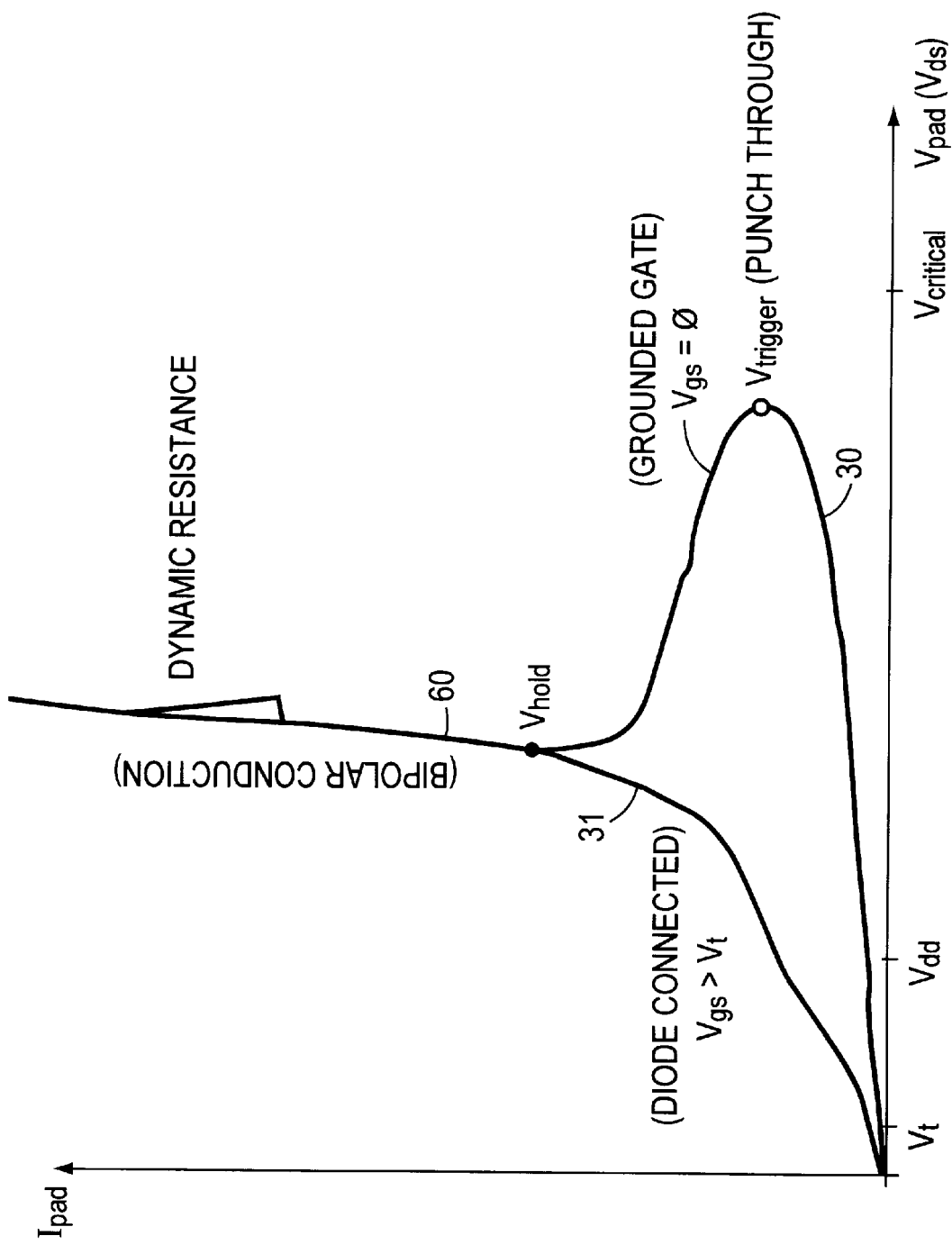
FIG. 2 is a plot of pad voltage, Vpad, versus pad current, Ipad, for two different gate-to-source voltages, Vgs, and illustrates how the invention guarantees that the ESD clamp transistor reaches a hold voltage before the protected operating logic circuits reach a trigger voltage.

FIG. 2 is a plot of the pad current, Ipad, versus the pad voltage, Vpad, and how their relationship changes with respect to the gate voltage, Vgs. Vpad is, of course, the same as the drain to source voltage, Vds, of the ESD clamp 16. When Vgs is at zero volts, (i.e., the grounded gate configuration), the ESD clamp transistor 16 exhibits a sharp punchthrough effect, as shown by the curve 30, whereby the voltage initially increases very rapidly until a trigger voltage, Vtrigger, is reached. Before this point, the ESD clamp 16 is off, so that effectively no current is conducted through the channel, and Ipad remains low.

After Vtrigger is reached, the current begins to rise, and the ESD clamp transistor 16 enters a bipolar conduction region. In this operating regime, although the transistor 16 is off (because Vgs is zero), a high voltage is forced across the drain-to-source interface. This results in a small amount of leakage current passing between the drain and source, since the impedance of the channel is not infinite. As Vds increases even further, depletion regions between P- and N-type materials increase in size, and thus the electric field produced by leakage current also increases. Eventually, this leakage current is sufficiently excited by the electric field energy to trigger channel conduction.

Once the channel does begin to conduct, its impedance is significantly lowered, and a large amount of current begins to flow. At this so-called punchthrough point, a high voltage, low current condition is maintained only for a short period of time. After that, the device enters the bipolar conduction region of fairly constant voltage, Vhold, and high current, as the field dissipates. If a Vcritical is ever reached, the device fails.

Curve 31 illustrates the behavior of the ESD clamp 16 when the gate voltage, Vgs, is greater than the threshold voltage, Vt (i.e., in the diode-connected configuration). In this regime, since the device is on, current flows from the drain to source in a much more orderly fashion. The device reaches the hold voltage, Vhold, much more quickly, and without experiencing as severe a punchthrough. Abnormal stresses on the device are hence greatly reduced as well.

The gate modulation circuit 19 (FIG. 1) thus ideally controls the ESD clamp 16 so that it operates on the lower curve 30 during normal operation, and then quickly switches to operate on curve 31 during an ESD event.

The pull-down transistor 21 will operate on the lower curve 30, or at least at some Vgs lower than the Vgs of the ESD clamp, even if a voltage is coupled to activate the pull-down transistor 21 (FIG. 1). Thus, the ESD clamp 16 is guaranteed to reach its hold voltage, Vhold, before the transistor 21 reaches is trigger voltage, Vtrigger. This effectively clamps the pad voltage, Vpad, to the hold voltage of the ESD clamp device 16, and not to the hold voltage of the pull-down transistor 21.

The ESD clamp 16 is itself protected by the gate modulation circuit 19 during an ESD event. In particular, whenever the gate voltage Vgs rises during an ESD event, the clamp 16 reaches the snapback voltage, Vhold. This allows the process engineer to select a Vtrigger for transistor 21 which is as large as possible, since this regime will not be encountered during an ESD event. It also improves reliability of the protection circuit 10, since Vtrigger will not be reached until the bipolar conduction regime is entered.

The invention is also useful in applications where the pad 12 experiences normal signal voltages greater than Vdd. For example, Vdd may be equal to three volts, but the signals applied to the pad 12 may swing from zero volts to a Vsignal max of five volts. In such an embodiment of the invention, as illustrated in FIG. 3, the ESD clamp transistor 46 is preferably a field oxide device having a thick field oxide.

In this circuit, Vgs is tailored, that is, it is allowed to swing between approximately zero volts and two and one-half volts during normal operation without activating the ESD clamp 16. Since the threshold voltage Vt of the field device 46 is quite high, in general, perhaps as high as seven volts, the two and one-half volts appearing at its gate during normal operation is insufficient to turn it on. This prevents a five-volt signal voltage at the pad 12 from appearing across any terminal of the field oxide clamp 46.

Figure 3:
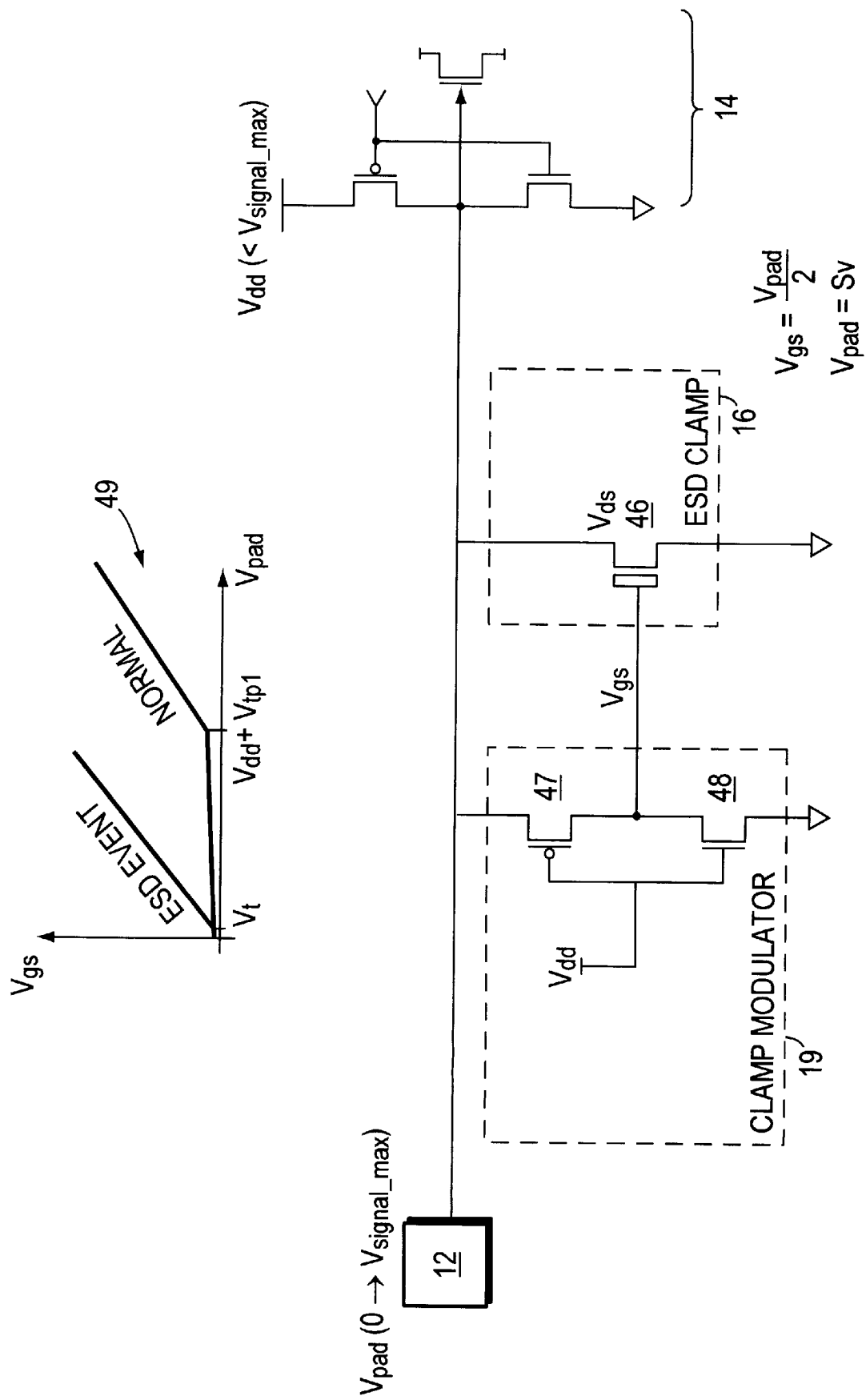
FIG. 3 is an electrical schematic diagram of an embodiment of the invention for use with operating logic circuits that use a reduced internal supply voltage.

As shown in the plot 49 of Vgs versus Vpad as depicted in FIG. 3, the pull-up transistor 47 is biased and/or is otherwise selected so that it begins to turn on when Vpad exceeds Vdd plus |Vtp|. Thus, as Vpad increases above three volts and approaches the Vsignal_max level, transistor 47 turns on, thereby increasing the gate voltage Vgs of the field oxide clamp 46. This, in turn, ensures that the drain to gate voltage of the clamp 46 never exceeds more than about three volts, thereby preventing undue stress on the clamp 46.

Figure 4:
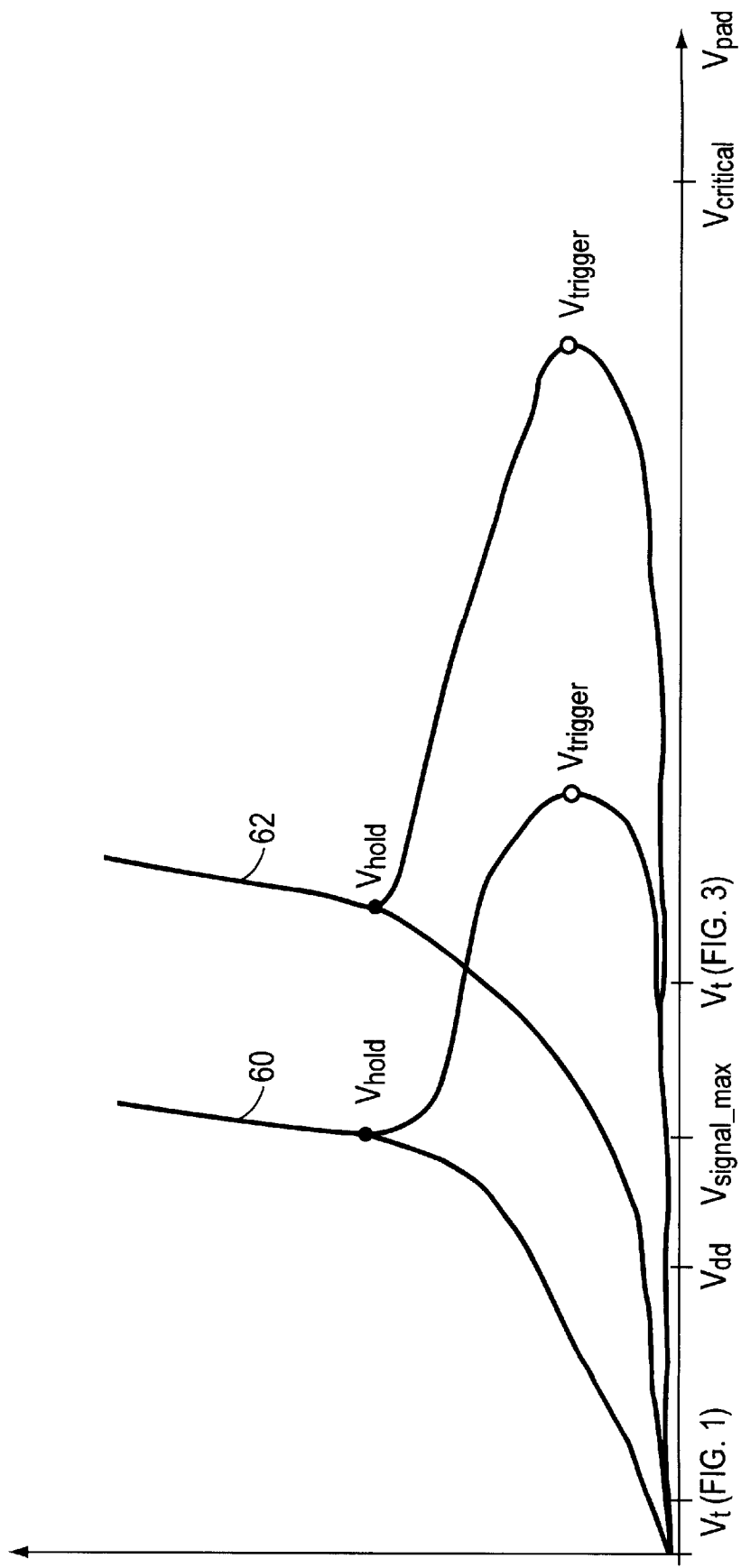
FIG. 4 is another plot of pad voltage, Vpad, versus pad current, Ipad, emphasizing the difference between a thin-oxide clamp having a low threshold voltage and a thick oxide device having a higher threshold voltage.

FIG. 4 replicates the plot 60 of FIG. 2 showing the operating characteristics of the ESD clamp 16 of FIG. 1, together with a plot 62 showing the operating characteristics of the ESD clamp 46 of FIG. 3. Note the effect of the increased threshold voltage, Vt, of the field oxide MOSFET 46. This prevents activation of the field oxide MOSFET 46 in FIG. 3 until the pad voltage exceeds the maximum normal signal voltage, Vsignal_max, applied to the pad 12.

The trigger voltage, Vtrigger, as well as the hold voltage, Vhold, are higher for the field oxide MOSFET 46 as well. This voltage shifting effect is not linear; that is, Vt is not increased by the same amount as Vtrigger or Vhold.

Figure 5:
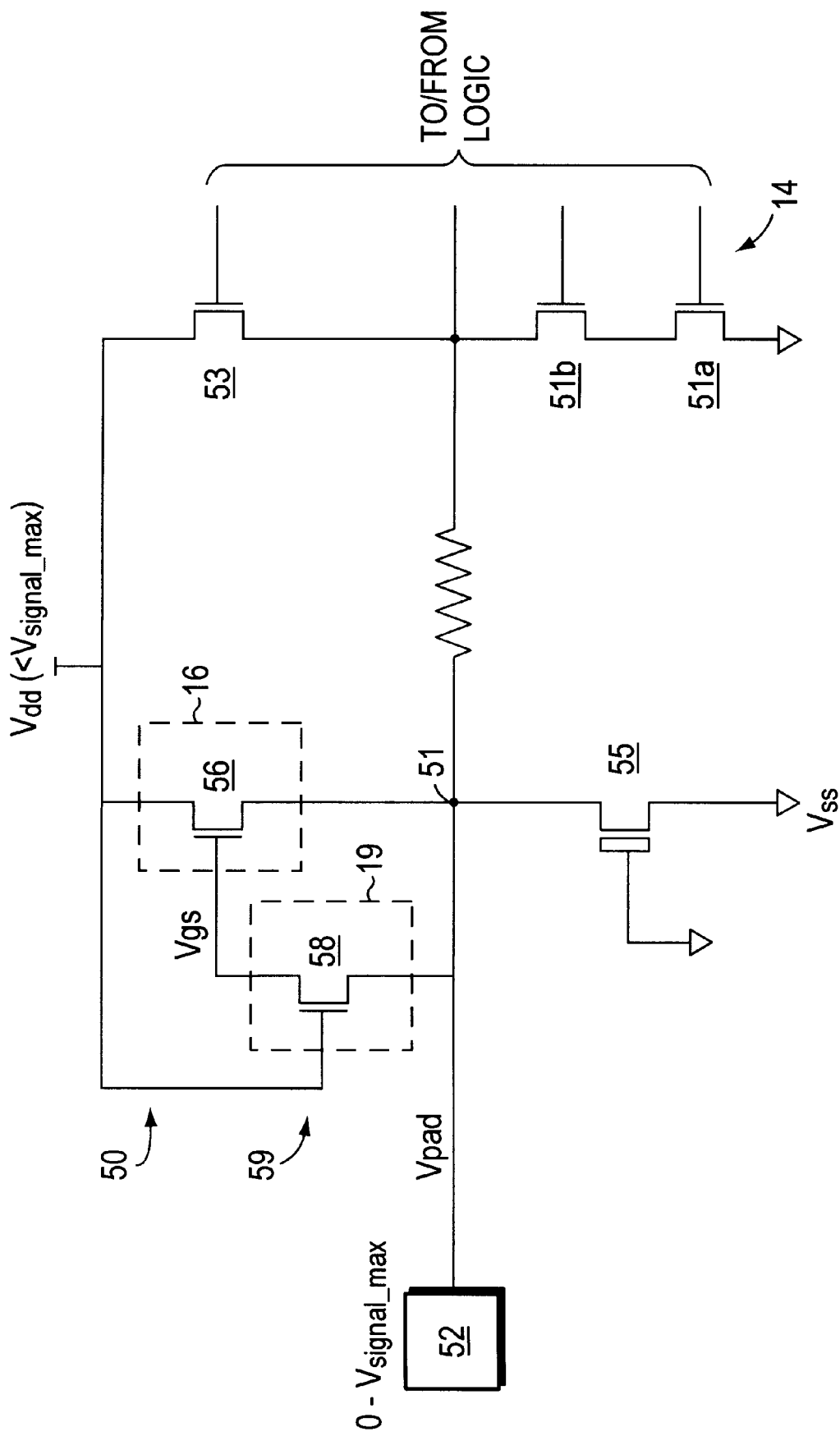
FIG. 5 is another embodiment of the invention, for use with N-channel (NMOS) operating circuits.

FIG. 5 shows another embodiment of the invention, as implemented where only N-type MOS (NMOS) transistors are available, and where the internal supply voltage Vdd is less than Vsignal_max. A problem occurs which did not exist in the circuits shown in FIGS. 1 and 3, where ESD protection was inherently provided to the P-channel pull-up transistor 20 (FIG. 1) or 40 (FIG. 3) via a virtual PNP transistor formed by the P-type diffusion into the substrate, the N-type channel material, and P-type gate material (not shown).

ESD protection is provided in this circuit by several devices, including a grounded-gate, field oxide transistor 55, a thin-gate, ESD clamp MOSFET 56, and a gate modulator 59 consisting of a pull-down transistor 58.

The field transistor 55 is connected with its drain terminal tied to the pad 52, and source terminal tied to Vdd. The single field oxide transistor 55 sufficiently protects the cascoded thin-oxide operating transistors 51a and 51b, since the Vhold and Vtrigger of the field oxide device 55 is greater than either of the thin oxide devices 51a or 51b alone. In other words, placing the devices 51a and 51b in cascode arrangement effectively doubles their Vhold and Vtrigger. Therefore, in this arrangement, the field oxide transistor 55 will always enter snapback before the protected stages 51a, 51b reach their trigger voltages.

In NMOS circuits such as those in FIG. 5, a pull-up transistor 53 in the operating logic 14 is not inherently protected, since no P-well exists as in FIGS. 1 and 3. However, the inventive protection circuit 10 can be used to protect the pull-up transistor 53 in this configuration.

In particular, the MOSFET 56 serves as the ESD clamp device 16, and the MOSFET pass device 58 serves as the gate modulation circuit 19. The ESD clamp 56 is connected between the pad 52 and the positive supply voltage, Vdd. Its gate voltage Vgs is controlled by the drain terminal of the pass-through transistor 58. The ESD clamp 56 is thus gated to the pad 52 by the MOSFET transistor 58 and will never turn on during normal circuit operation. Transistor 58 thus acts as a pass-through, so that the gate voltage, Vgs, of the clamp 56 is at the same potential as the pad 52 when Vpad is less than Vdd plus V |tp|, where Vtp is the threshold voltage of MOSFET 58. As Vpad increases, Vgs will remain clamped at approximately two to three volts.

The ESD reliability of pass transistor 58 is not a problem since it is itself protected by the clamp 56. During an ESD event, when Vpad rises sufficiently to turn the ESD clamp 56 on, the field oxide transistor 55 then clamps the pad 52 to its own hold voltage, thereby ensuring the cascode 51a, 51b remains turned off and protected. In addition, because the ESD clamp 56 is directly tied to the pad 52, the ESD clamp 56 will always turn on first and thus prevent the gate modulator MOSFET 58 from ever reaching punchthrough, effectively protecting pull-up transistor 53.

The foregoing description has been limited to a specific embodiment of this invention. It will be apparent, however, that variations and modifications may be made to the invention, with the attainment of some or all of its advantages. It is the object of the appended claims to cover all such variations and modifications as come within the true spirit and scope of the invention.

What is claimed is:

1. A protection circuit for protecting an integrated circuit (IC) device from damage due to electrostatic discharge (ESD) voltages applied to an input or output (I/O) signal pad of the IC, the protection circuit comprising:
    an ESD clamp device having a first terminal connected to the signal pad, a second terminal connected to a ground reference voltage, and a control terminal, the control terminal for selectively connecting the first and second terminals together; and
    a modulation circuit coupled to the ESD clamp, the modulation circuit disabling the ESD clamp during normal operation and thus disconnecting the signal pad from the ground reference voltage, but, when the voltage at the signal pad exceeds a predetermined control voltage indicating an ESD event, the modulation circuit enabling the ESD clamp and thus connecting the signal pad to the ground reference voltage said modulation circuit being an inverter that has a signal input terminal, a signal output terminal, and a supply voltage terminal, with the signal input terminal being connected to an operating supply voltage, the signal output terminal being connected to said control terminal, and the supply voltage terminal being connected to the signal pad.

2. A protection circuit as in claim 1 wherein the gate modulation circuit additionally controls the voltage applied to the gate of the ESD clamp such that the ESD clamp reaches a hold voltage via an increase in channel current without passing through a trigger voltage.

3. A protection circuit as in claim 1 wherein the predetermined control voltage is selected such that during an ESD event, the ESD clamp is guaranteed to be clamped at a drain-to-source hold voltage before an operating circuit reaches a trigger voltage.

4. A protection circuit as in claim 1 wherein the inverter further comprises:
    an N-channel MOSFET having gate, drain, and source terminals, the drain being connected to the control terminal of the ESD clamp, the source being connected to the ground reference voltage, and the gate being connected to the operating supply voltage; and
    a P-channel MOSFET having a gate, drain, source, and N-well terminals, the N-well terminal being allowed to float, the source being connected to the signal pad, the drain being connected to the control terminal of the ESD clamp, and the gate being connected to the operating supply voltage.

5. A protection circuit as in claim 1 wherein the ESD clamp device comprises:
    an N-channel metal oxide semiconductor field effect transistor (MOSFET) having gate, drain, and source terminals, with the drain being the first terminal connected to the signal pad, the source being the second terminal connected to the ground reference voltage, and the gate being the control terminal.

6. A protection circuit as in claim 5 wherein the modulation circuit comprises:
    an N-channel MOSFET having gate, drain, and source terminals, the drain being connected to the control terminal of the ESD clamp, the source being connected to the ground reference voltage, and the gate being connected to the operating supply voltage; and
    a P-channel MOSFET having a gate, drain, source, and N-well terminals, the N-well terminal being allowed to float, the drain being connected to the signal pad, the source being connected to the control terminal of the ESD clamp, and the gate being connected to the operating supply voltage.

7. A protection circuit as in claim 1 wherein a maximum normal signal voltage applied to the signal pad is greater than the operating supply voltage used to power the integrated circuit.

8. A protection circuit as in claim 7 wherein the ESD clamp has a threshold voltage greater than the maximum normal signal voltage.

9. A protection circuit as in claim 8 wherein the ESD clamp is a field oxide MOSFET.

10. A protection circuit for protecting an integrated circuit (IC) device from damage due to electrostatic discharge (ESD) voltages applied to an input or output (I/O) signal pad of the IC, the protection circuit comprising:

an ESD clamp device having a first terminal connected to an operating supply voltage, a second terminal connected to the pad signal, and a control terminal, the control terminal for selectively connecting the first and second terminals together; and a modulation circuit connected to the control terminal of the ESD clamp, the modulation circuit disabling the ESD clamp during normal operation and thus disconnecting the signal pad from the ground reference voltage, but, when the voltage at the signal pad exceeds a predetermined control voltage indicating an ESD event, the modulation circuit enabling the ESD clamp and thus connecting the signal pad to the ground reference voltage.

11. A protection circuit as in claim 10 wherein the modulation circuit comprises:

an N-channel MOSFET having gate, drain, and source terminals, the drain being connected to the control terminal of the ESD clamp, the gate being connected to the control voltage, and the source being connected to the signal pad.

12. A protection circuit as in claim 10 wherein the modulation circuit comprises:

an N-channel MOSFET having gate, drain, and source terminals, the drain being connected to the control terminal of the ESD clamp, the source being connected to the reference voltage, and the gate being connected to the operating supply voltage.

13. A protection circuit as in claim 12 wherein the modulation circuit additionally comprises:

means for coupling the control terminal of the ESD clamp to the signal pad during an ESD event.

14. A protection circuit for protecting operating logic circuits in an integrated circuit (I/C) device from damage due to electro-static discharge (ESD) voltages applied to an input/output (I/O) signal pad of the IC, the protection circuit comprising:

an ESD clamp device having a drain terminal, a source terminal, and a gate terminal, the drain and source terminals connected between the signal pad and a ground reference voltage; and a gate modulation circuit comprising:

an N-channel metal oxide semiconductor field effect transistor (MOSFET) having gate, drain, and source terminals, the N-channel transistor drain terminal being connected to the gate of the ESD clamp, the N-channel transistor source terminal being connected to the ground reference voltage, and the N-channel transistor gate terminal being connected to a power supply voltage that provides power to the operating logic circuits; and a P-channel MOSFET having gate, drain, source, and N-well terminals, the N-well terminal being allowed to float, the P-channel transistor drain terminal being connected to the signal pad, the P-channel transistor source terminal being connected to the gate of the ESD clamp, and the P-channel gate terminal being connected to the power supply voltage, the gate modulation circuit normally connecting the gate of the ESD clamp to the disabling voltage, but, when the voltage at the signal pad exceeds a predetermined threshold voltage, the gate modulation circuit otherwise connecting the gate of the ESD clamp to the signal pad.

15. A protection circuit as in claim 14 wherein the gate modulation circuit additionally controls the voltage applied to the gate of the ESD clamp such that the ESD clamp reaches a drain-to-source snapback voltage via an increase in channel current without passing through a drain-to-source junction punchthrough voltage.

16. A protection circuit as in claim 14 wherein the threshold voltage is selected such that the ESD clamp is guaranteed to be clamped at a drain-to-source snapback voltage before junction breakdown occurs in the operating logic circuits.

17. A protection circuit as in claim 14 wherein the drain terminal of the ESD clamp is connected to the signal pad and the source terminal of the ESD clamp is connected to the ground reference voltage.

18. A protection circuit as in claim 14 wherein the reference voltage is the same as the reference voltage.

19. A protection circuit as in claim 14 wherein the reference voltage is a ground reference voltage.

20. A protection circuit as in claim 14 wherein the ESD clamp device comprises:

an N-channel metal oxide semiconductor field effect transistor (MOSFET) having gate, drain, and source terminals, with the drain being connected to the signal pad, and the source being connected to the reference voltage.

21. The protection circuit of claim 14 wherein said ESD clamp device is an N-channel MOSFET.

* * * * *